(12) United States Patent
Liu et al.

(10) Patent No.: US 10,834,816 B2
(45) Date of Patent: Nov. 10, 2020

(54) PRINTED CIRCUIT BOARD STRUCTURE, AND WIRING METHOD THEREFOR

(71) Applicant: CANAAN CREATIVE CO., LTD., Beijing (CN)

(72) Inventors: Xuguang Liu, Beijing (CN); Nangeng Zhang, Beijing (CN)

(73) Assignee: CANAAN CREATIVE CO., LTD., Beijing (CN)

( * ) Notice: Subject to any disclaimer, the term of this patent is extended or adjusted under 35 U.S.C. 154(b) by 0 days.

(21) Appl. No.: 16/647,829

(22) PCT Filed: Apr. 20, 2018

(86) PCT No.: PCT/CN2018/083925
§ 371 (c)(1),
(2) Date: Mar. 16, 2020

(87) PCT Pub. No.: WO2019/056749
PCT Pub. Date: Mar. 28, 2019

(65) Prior Publication Data
US 2020/0221572 A1 Jul. 9, 2020

(30) Foreign Application Priority Data
Sep. 19, 2017 (CN) .......................... 2017 1 0845597

(51) Int. Cl.
*H05K 1/11* (2006.01)
*H05K 3/00* (2006.01)

(52) U.S. Cl.
CPC ............ *H05K 1/111* (2013.01); *H05K 3/0005* (2013.01); *H05K 2201/09227* (2013.01); *H05K 2201/09781* (2013.01)

(58) Field of Classification Search
CPC ................. H05K 1/111; H05K 3/0005; H05K 2201/09227; H05K 2201/09781; H05K 1/0296; H05K 1/11; H05K 3/0002
(Continued)

(56) References Cited

U.S. PATENT DOCUMENTS

| 6,232,564 B1* | 5/2001 | Arndt | H05K 1/114 174/255 |
| 2006/0030075 A1* | 2/2006 | Sugiyama | H01L 24/29 438/108 |
| 2007/0034405 A1* | 2/2007 | Brown | H01L 23/49816 174/262 |

FOREIGN PATENT DOCUMENTS

| CN | 101862897 A | 10/2010 |
| CN | 201789682 U | 4/2011 |

(Continued)

*Primary Examiner* — Sherman Ng
(74) *Attorney, Agent, or Firm* — Muncy, Geissler, Olds & Lowe, P.C.

(57) ABSTRACT

A printed circuit board structure and a wiring method therefor are disclosed. The printed circuit board structure comprises a first wiring channel formed inside the printed circuit board for transmitting a circuit signal; a pin, connected to the first wiring channel for connecting a chip to the printed circuit board; the pin comprising an unused pin and a used pin, the used pin comprising a peripheral pin and an internal pin; wherein the printed circuit board further comprises a second wiring channel, the second wiring channel leads out the internal pin by means of covering at least a portion of the unused pin. By means of using a printed circuit board structure and a wiring method to configure pins of the printed circuit board, the number of printed circuit board layers is reduced, and the current carrying capacity is enhanced.

13 Claims, 8 Drawing Sheets

(58) Field of Classification Search
USPC .......................................................... 174/250
See application file for complete search history.

(56) References Cited

FOREIGN PATENT DOCUMENTS

| | | |
|---|---|---|
| CN | 103313507 A | 9/2013 |
| CN | 103500717 A | 1/2014 |
| CN | 206039357 U | 3/2017 |
| CN | 107426916 A | 12/2017 |
| CN | 207219152 U | 4/2018 |
| JP | H08-242045 A | 9/1996 |

* cited by examiner

PRINTED CIRCUIT BOARD STRUCTURE, AND WIRING METHOD THEREFOR

BACKGROUND OF THE INVENTION

1. Field of the Invention

The invention relates to the field of electronic and electric applications, and in particular, to a printed circuit board structure and a wiring method therefor.

2. Related Art

Currently, I/O pins of programmable logic devices such as single chip microcomputer, DSP, FPGA, and CPLD that are commonly used in electronic devices can be configured in different modes such as pull-up, pull-down and so on according to requirements, while some programmable logic devices have fewer external devices, and many I/O pins are not used. Since such chips are mostly BGA packages (ball grid array packages), the pins are distributed densely (which are also applicable for SOP, QFN, PLCC), and multiple circuit layers are required to lead out the desired network, power supply and ground, but since the used I/O pins are few, each circuit layer is not highly utilized, so from the aspect of the printed circuit board, design of such printed circuit board is not reasonable.

FIG. 1 is a structural diagram of pins of a chip of a programmable logic device. As shown in FIG. 1, peripheral pins 25 of a chip 17 can be led out by connection lines on a layer where the chip 17 is located. However, since leading out of the peripheral pins 25 has occupied connection line channels, other internal pins 26 in FIG. 1 cannot be directly led out by the connection lines on the layer where the chip 17 is located, and it is necessary to punch holes to lead out an internal wiring channel layer for leading out the internal pins 26 that cannot be led out by the connection lines on the layer where the chip 17 is located, such that the number of layers of the wiring channel is increased.

FIG. 2 illustrates design of a conventional printed circuit board, and FIG. 3 is a simplified diagram of design of the conventional printed circuit board. As shown in FIGS. 2 and 3, it can be seen that the layer where the chip is located in the printed circuit board 10 has a large-area wiring channel 24, but network of the wiring channel 24 is not effectively led out, because the wiring channel 24 has to avoid pins of network of a non-wiring channel, resulting in that an effective channel of the wiring channel 24 is not wide, as shown by oval portions in FIGS. 2 and 3. Such wiring channel 24 has a poor current carrying capacity, and cannot satisfy requirement for power consumption of the chip, so the network also shall be connected to the internal wiring channel through a via hole to be led out. Therefore, the number of the printed circuit board layers must be increased.

SUMMARY OF THE INVENTION

To solve the above problems, the invention provides a printed circuit board structure, and a wiring method therefor, which reduces the number of layers of internal wiring channels of the printed circuit board, enhances the current carrying capacity, and saves production cost of the printed circuit board.

To achieve the above object, the invention provides a printed circuit board structure, comprising:

a first wiring channel formed inside the printed circuit board for transmitting a circuit signal;

pins connected to the first wiring channel for connecting a chip to the printed circuit board;

the pins comprising unused pins and used pins, the used pins comprising peripheral pins and internal pins;

wherein the printed circuit board further comprises a second wiring channel that leads out the internal pins by covering at least a portion of the unused pins;

wherein a preset level network is further formed on the printed circuit board, and the second wiring channel is disposed on a layer where the chip is located for leading out the internal pins to be connected to the preset level network;

wherein the used pins are pins configured in different modes for realizing desired functions of circuit design, and the unused pins are pins that are not used for realizing the desired functions of circuit design.

In the above printed circuit board structure above, at least a portion of the covered unused pins comprises the unused pins on a path of the second wiring channel.

In the above printed circuit board structure, connection between the unused pins on the path of the second wiring channel and the preset level network does not affect functional/electrical characteristics of the chip.

In the above printed circuit board structure, the preset level network is a network with a fixed level.

In the above printed circuit board structure, the preset level network is a power supply and/or a ground network.

In the above printed circuit board structure, the chip is a programmable logic device.

In the above printed circuit board structure, the unused pins of the chip on the path of the second wiring channel are programmable, and a voltage of the preset level network connected thereto does not exceed a voltage set by the unused pins.

To achieve the above object, the invention provides a wiring method for a printed circuit board, comprising:

planning a planning path connected to a preset level network according to the preset level network;

configuring pins on the printed circuit board according to the planning path;

configuring the pins as used pins and unused pins;

configuring a preset level for the unused pins according to function and requirement of the chip;

forming a wiring channel according to distribution of the preset level network and the planning path;

wherein the wiring channel covers at least a portion of the unused pins on the planning path, and is connected to the preset level network;

wherein the wiring channel is disposed on a layer where the chip is located for leading out the unused pins to be connected to the preset level network;

wherein the unused pins on the planning path are programmable, a voltage of the preset level network connected thereto does not exceed a preset level configured for the unused pins, and connection to the preset level network does not change functional/electrical characteristics of the chip.

In the wiring method for a printed circuit board, the covered unused pins comprise the unused pins on the planning path.

In the wiring method for a printed circuit board, a level of the preset level network is fixed.

In the wiring method for a printed circuit board, the preset level network is a power supply and/or a ground network.

To achieve the above object, the invention further provides a computing board for a computing device, comprising a printed circuit board and a plurality of computing chips mounted on the printed circuit board, wherein the printed circuit board comprises any one of the printed circuit boards.

To achieve the above object, the invention further provides a computing device, comprising a control board, a connecting board, a heat radiator, and a plurality of computing boards, the computing boards connected to the control board through the connecting board, and the heat radiator arranged on lateral sides of the computing boards, wherein the computing boards comprise any one of the computing boards.

Advantageous effects using the structure and the wiring method for a printed circuit board are as follows:

(1) The used pins of the chip are connected to a power supply or ground as required through the wiring channel on the layer where the chip is located without avoiding pins of network of the non-wiring channel, so the wiring channel on the layer where the chip is located can be effectively used to lead out the power supply or ground, and it is unnecessary to punch holes to be connected to the internal wiring channel layer, thereby reducing the number of the printed circuit board layers, and further lowering product cost and production cycle;

(2) A width of the wiring channel is increased by configuring unused I/O pins to a power supply or a ground network, and since the I/O pins on the printed circuit board are coated with tin paste for soldering with the chip, the channel is actually larger. Moreover, since the tin paste and pins of the chip itself also carry current, the width of the wiring channel is increased, a thickness thereof is also increased, and the current carrying capacity far exceeds that of the internal wiring channel layer connected by punching holes.

Hereinafter the invention is explicitly described with reference to the accompanying drawings and detailed embodiments, but the invention is not limited thereto.

DETAILED EMBODIMENTS OF THE INVENTION

Hereinafter the structure principle and operating principle of the invention are explicitly described with reference to the accompanying drawings:

Some terms are used in the specification and subsequent claims to refer to specific components. Those with common knowledge in the art shall understand that manufacturers may use different nouns to refer to the same component. The specification and subsequent claims do not distinguish the components with different names, but using difference of components in function as the distinguishing standard. In the whole text, the same reference sign refers to the same element.

The terms "comprise" and "include" mentioned in the whole text and subsequent claims are open phrases, and shall be interpreted as "include but not limited to". In addition, the word "connection" here includes any direct or indirect electrical connection means. The indirect electrical connection means comprises connection through other apparatus.

It shall be clarified in advance that the pin leading-out structure of the printed circuit board herein is not for the I/O pins of the programmable device only, but for the pins changing the network of the unused pins while not changing functional or electrical characteristics of the chip or device, effective wiring channels can be increased through the pin leading-out structure and the wiring method of the invention. In addition, since the I/O pins of the programmable device can be configured and mapped as required, and different chips have different requirements, a corresponding device manual shall be viewed concerning which I/O pins particularly have what configurations or mappings.

Some embodiments of the invention will be described comprehensively with reference to the accompanying drawings, in which some but not all embodiments are illustrated. Actually, various embodiments of the invention may be implemented in many different forms, and shall not be interpreted as limitation to the embodiments set forth herein. In contrast, these embodiments are provided to allow the invention to satisfy applicable legal requirements.

Embodiment 1

Figure 4:
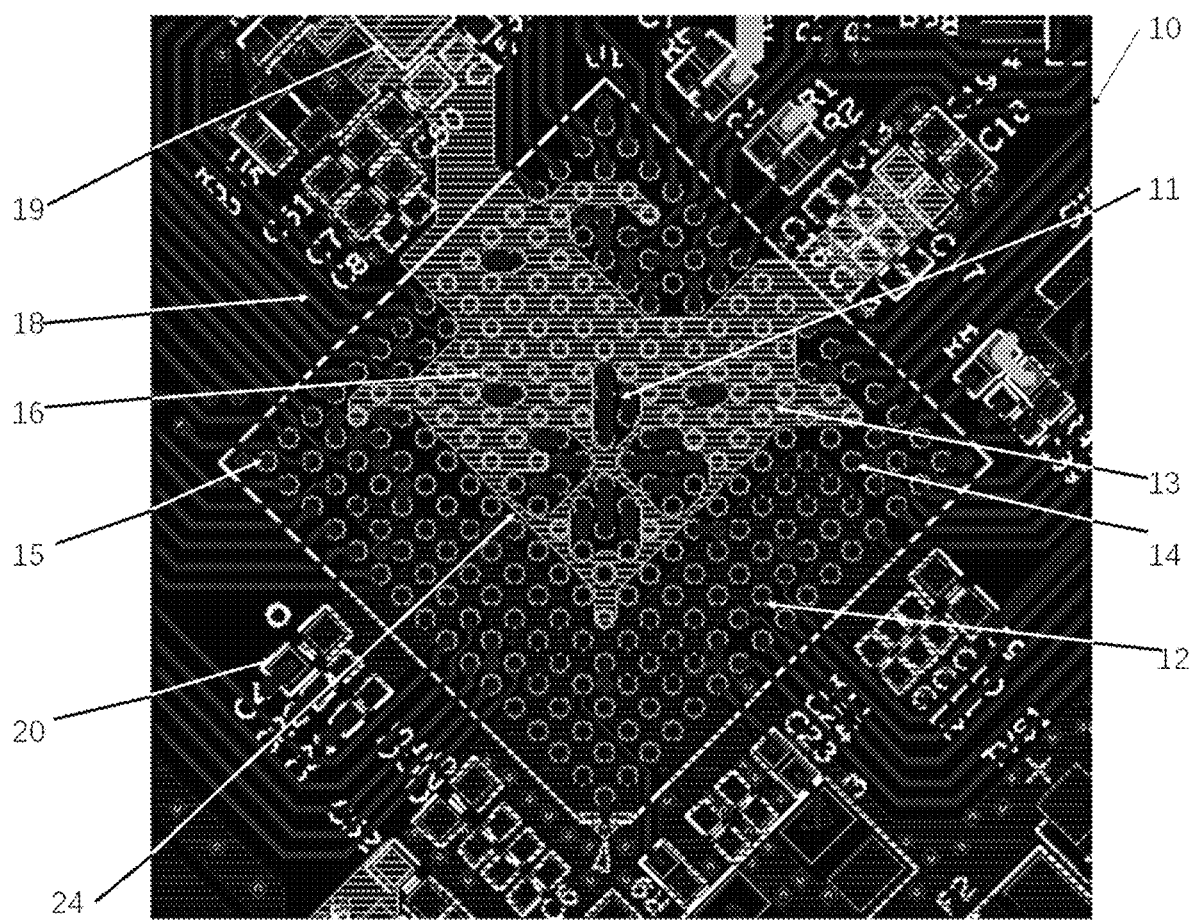
FIG. 4 is a schematic diagram of a printed circuit board structure according to one embodiment of the invention.
Figure 5:
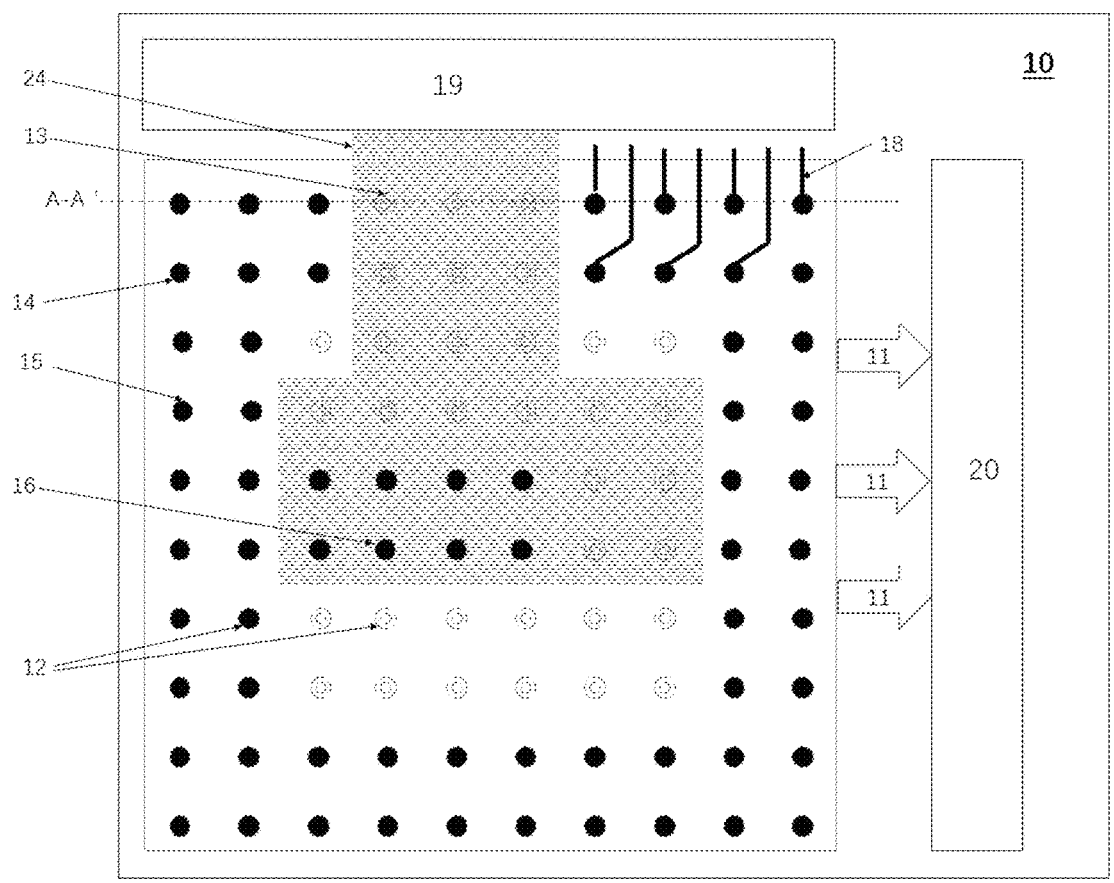
FIG. 5 is a simplified diagram of the printed circuit board structure according to the embodiment of the invention.

In a first exemplary embodiment of the invention, an optimized printed circuit board structure is provided. FIG. 4 is a schematic diagram of a printed circuit board structure according to one embodiment of the invention, and FIG. 5 is a simplified diagram of the printed circuit board structure according to the embodiment of the invention. As shown in FIGS. 4 and 5, the diagonal portion is a wiring channel 24 for leading out a power supply and/or a ground network. The pin leading-out structure of the printed circuit board 10 of the invention comprises used pins 22, unused pins 23, and the wiring channel 24.

Hereinafter respective components of the pin leading-out structure designed for the optimized printed circuit board in this embodiment are respectively described in detail.

The printed circuit board 10 comprises pins 12 for connecting a chip to the printed circuit board 10, and an internal wiring channel 11 for connecting the pins 12 and a peripheral circuit 20 and transmitting a circuit signal between the pins 12 and the peripheral circuit 20.

The pins of the chip are configured as used pins and unused pins according to the function to be achieved by the chip. The used pins are used to achieve a certain circuit function, and the unused pins are pins that are not used for achieving the circuit function.

The printed circuit board 10 has pins 12 corresponding to the pins of the chip, wherein unused pins 13 correspond to the unused pins of the chip, and used pins 14 correspond to the used pins of the chip. The used pins 14 can also be divided into peripheral pins 15 and internal pins 16 according to positions.

The peripheral pins 15 on the printed circuit board 10 can be directly led out by a connection line 18 on a layer where the chip is located, and the internal pins 16 are led out through the wiring channel 24.

The wiring channel 24 is disposed on the layer where the chip is located for leading out the internal pins 16 of the chip, thereby connecting the internal pins 16 of the chip to a preset level network 19. The wiring channel 24 covers the internal pins 16 in the used pins 14.

Figure 6:
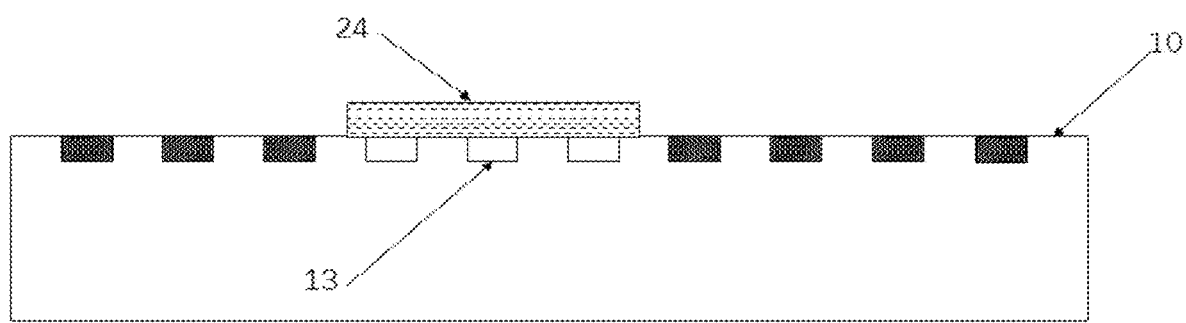
FIG. 6 is a schematic diagram of a longitudinal section along A-A' in FIG. 5.

FIG. 6 is a schematic diagram of longitudinal section along A-A' in FIG. 5. As shown in FIGS. 5 and 6, the wiring channel 24 also covers the unused pins 13 on a path of the wiring channel 24 connected to the preset level network 19. Change of the preset level network connected to the unused pins 13 on the path of the wiring channel 24 does not change functional/electrical characteristics of the chip.

In particular, a level of the preset level network 19 is fixed. If a digital signal is led out in this way, the level of the unused I/O pins also alternates between high and low levels as the digital signal, resulting in large power consumption of the chip, so the level of the unused I/O pins is preferably fixed and unchangeable. Preferably, the preset level network is a power supply or a ground network.

The unused pins 13 on the path of the wiring channel that can be covered by the wiring channel 24 shall be programmable. As for the I/O pins of a common programmable device, they are generally programmable. The unused I/O pins are configured to a corresponding power supply or ground through the wiring channel 24, such that the power supply or ground of the chip 17 can be effectively led out by the wiring channel 24 on the layer where the chip is located.

In addition, some I/O pins of the programmable device have a fixed high level, while some have a high level associated with the level of power supply pins of the I/O pins. A power supply voltage connected to the unused pins cannot exceed a voltage set by the unused pins. Since different banks have a variable number of I/O pins, the voltage of the I/O pins of different banks has different settings, such as 3.3V, 1.8V and the like. For example, if an I/O pin belongs to the bank of 1.8V, while what shall be led out is the power supply of 3.3V, this pin will be burnt down due to a voltage exceeding 1.8V. Therefore, this pin shall be avoided.

Of course, the above structure can further include other functional modules, such as, other wiring channel layers, which can be understood by those skilled in the art. Moreover, those skilled in the art also can add corresponding functional modules according to the requirement for function, and the details are not described herein.

The invention is aiming at the design problem of the printed circuit board where the I/O pins of the programmable device are seldom used, but a utilization rate of each circuit layer is low. By means of optimizing design of the printed circuit board, the number of layers is reduced, and the utilization rate of the circuit layer is improved, thereby lowering product cost, shortening production cycle, and optimizing design of the printed circuit board in an area where the programmable device is located.

Till now, the optimized printed circuit board structure in the first embodiment of the invention has been introduced.

Embodiment 2

Figure 7:
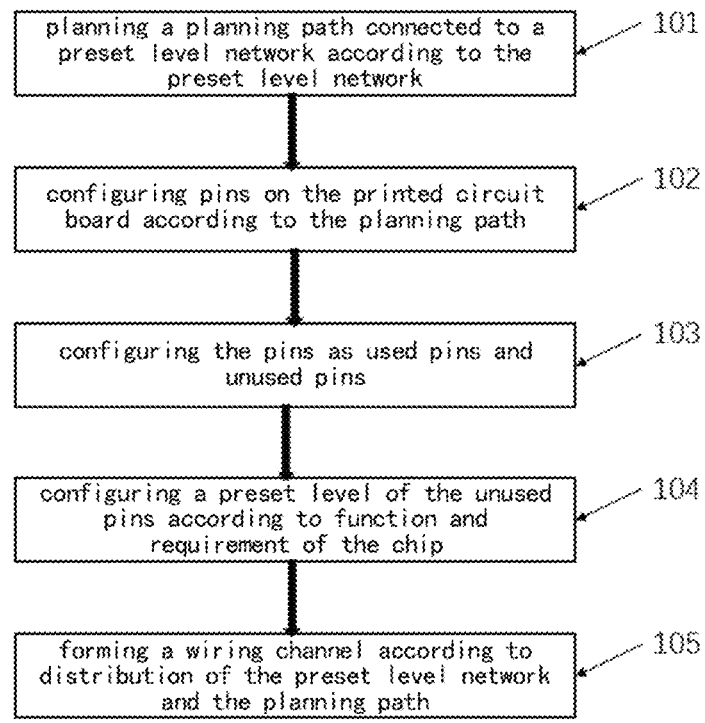
FIG. 7 is a flow chart of a wiring method for an optimized printed circuit board according to the embodiment of the invention.

In a second exemplary embodiment of the invention, a wiring method for a printed circuit board is provided. FIG. 7 is a flow chart of the wiring method for a printed circuit board according to the embodiment of the invention. As shown in FIG. 7, the wiring method for a printed circuit board of the invention comprises:

step 101, planning a planning path connected to a preset level network according to the preset level network, and determining a leading-out direction of a wiring channel;

step 102, configuring pins on the printed circuit board according to the planning path, and configuring pins of a chip connected to the printed circuit board simultaneously;

step 103, configuring the pins as used pins and unused pins according to circuit function to be achieved by the chip;

step 104, configuring a preset level for the unused pins according to function and requirement of the chip, and configuring the unused pins on the planning path of the wiring channel according to distribution of the preset level network and a level of the preset level network connected to the unused pins. The unused pins on the planning path are configurable, and do not change functional/electrical characteristics of the chip/device after being connected to the preset level network; and step 105, forming a wiring channel on a layer where the chip is located by covering the unused pins on the planning path according to distribution of the preset level network and the planning path, wherein the wiring channel is connected to the preset level network.

The wiring method for a printed circuit board of the invention is suitable for leading out a fixed level network. Preferably, the preset level network is a power supply or a ground network. If a digital signal is led out in this way, the level of the unused I/O pins alternates between high and low levels as the digital signal, which causes function disorder of the chip. Therefore, the level of the unused I/O pins is preferably fixed and unchangeable.

It shall be noted that:

1. Whether the unused pins on the planning path of the wiring channel can be configured to a power supply or a ground network. If configuration to the power supply or the ground network affects functional/electrical characteristics of the chip/device, the wiring channel on the layer where the chip is located shall avoid, and the power supply or the ground network cannot or cannot be effectively led out.

2. The unused pins that can be covered by the wiring channel shall be programmable IO pins, which can be defined according to user's requirements. However, it shall be noted about difference between the level of the pins and the power supply network, and the power supply voltage connected to the unused pins cannot exceed the voltage set by the unused pins. Since different banks have a variable number of I/O pins, the voltage of the I/O pins of different banks has different settings, such as, 3.3V, 1.8V, and the like. For example, if an I/O pin belongs to the bank of 1.8V, but what shall be led out is the power supply of 3.3V, this pin will be burned down due to a voltage exceeding 1.8V. Therefore, this pin shall be avoided.

The used pins of the chip are connected to a power supply or ground as required through the wiring channel on the layer where the chip is located without avoiding pins of network of the non-wiring channel, so the wiring channel on the layer where the chip is located can be effectively used to lead out the power supply or ground, and it is unnecessary to punch holes to be connected to the internal wiring channel layer, thereby reducing the number of the printed circuit board layers, and further lowering product cost and production cycle. The method can only be applied to the programmable chip with a large number of unused I/O pins, or the case where the unused I/O pins are on the channel planned to lead out the power supply or the ground, and the wiring channel on the layer where the chip is located for the power supply or the ground of the programmable chip is led out effectively. The package type is not limited. As long as the leading-out wiring channel of the power supply or ground are blocked or interrupted by the unused I/O pins, these unused I/O pins can be configured to the power supply or ground network, so that the wiring channel can lead out the power supply or ground network.

When the unused I/O pins block the wiring channel where the power supply or ground shall be led out, the wiring channel can also be led out. Only when a width of the wiring channel is too narrow to satisfy the current carrying capacity, the unused I/O pins can be configured to the power supply or ground network, such that the width of the wiring channel can be increased. Moreover, the I/O pins on the printed circuit board are coated with tin paste for soldering with the chip, and since the tin paste and the pins of the chip itself carry current also, the channel is actually larger, so the width of the wiring channel is increased, and a thickness of the wiring channel is also increased. Moreover, the current carrying capacity far exceeds that of the internal wiring channel connected by punching holes. Therefore, configuring the I/O pins with the method for optimizing design of the printed circuit board in the invention can not only reduce the printed circuit board layers, but also enhance the current carrying capacity.

Figure 8A:
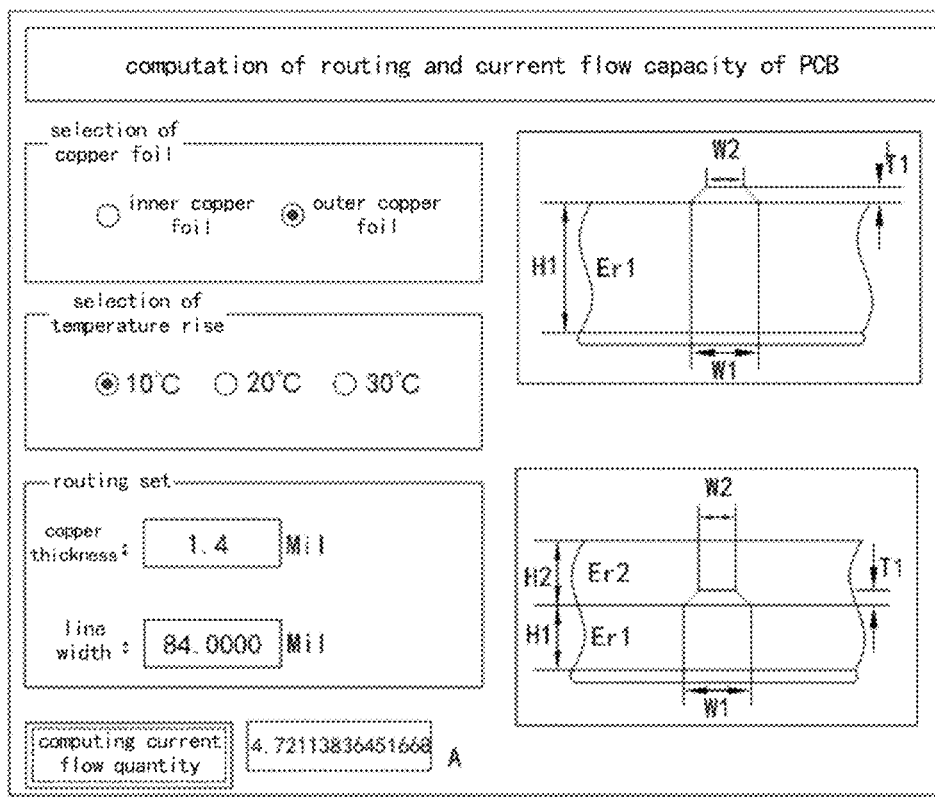
FIGS. 8A-8B are analysis results of routing capacity and current flow capacity of the corresponding printed circuit board of FIG. 4 according to the embodiment of the invention.
Figure 8B:
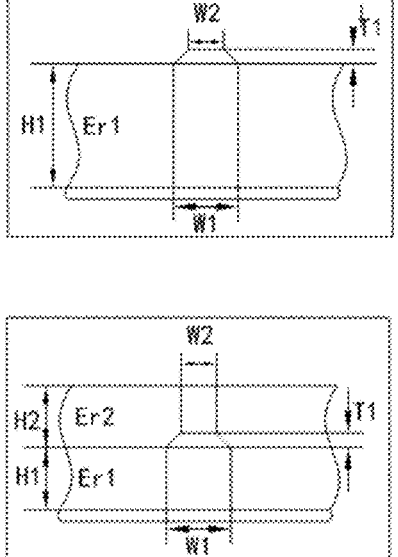

FIGS. 8A-8B are analysis results of routing capacity and current flow capacity of the corresponding printed circuit board of FIG. 4 according to the embodiment of the invention. FIG. 8A is analysis results of routing and current flow capacities of a right side channel of the corresponding printed circuit board of FIG. 4, and FIG. 8B is analysis results of routing and current flow capacities of a left side channel of the corresponding printed circuit board of FIG. 4. As can be seen from FIGS. 8A and 8B, under the condition of 10 degrees of temperature rise, a right side routing channel has a line width of 84 Mil, and a current carrying capacity of 4.7 A, and a left side routing channel has a line width of 114 Mil, and a current carrying capacity of 5.9 A, so that a total current carrying capacity of the two side channels is 10.6 A.

Figure 1:
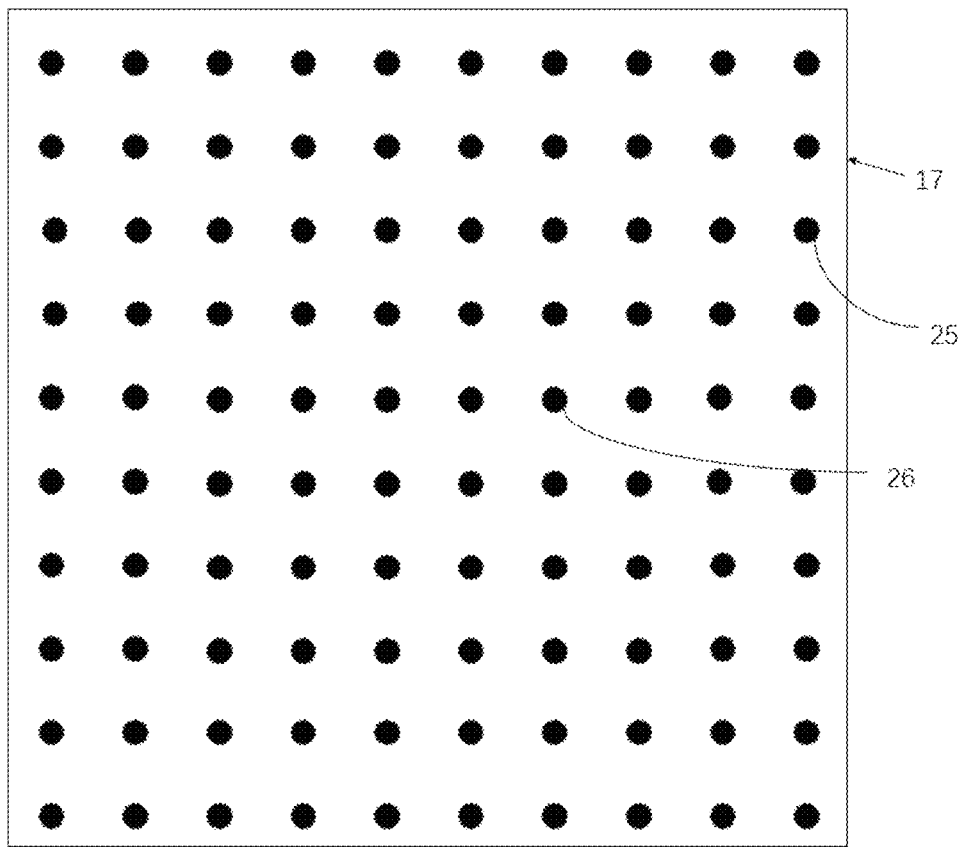
FIG. 1 is a structural diagram of pins of a chip of a programmable logic device.
Figure 2:
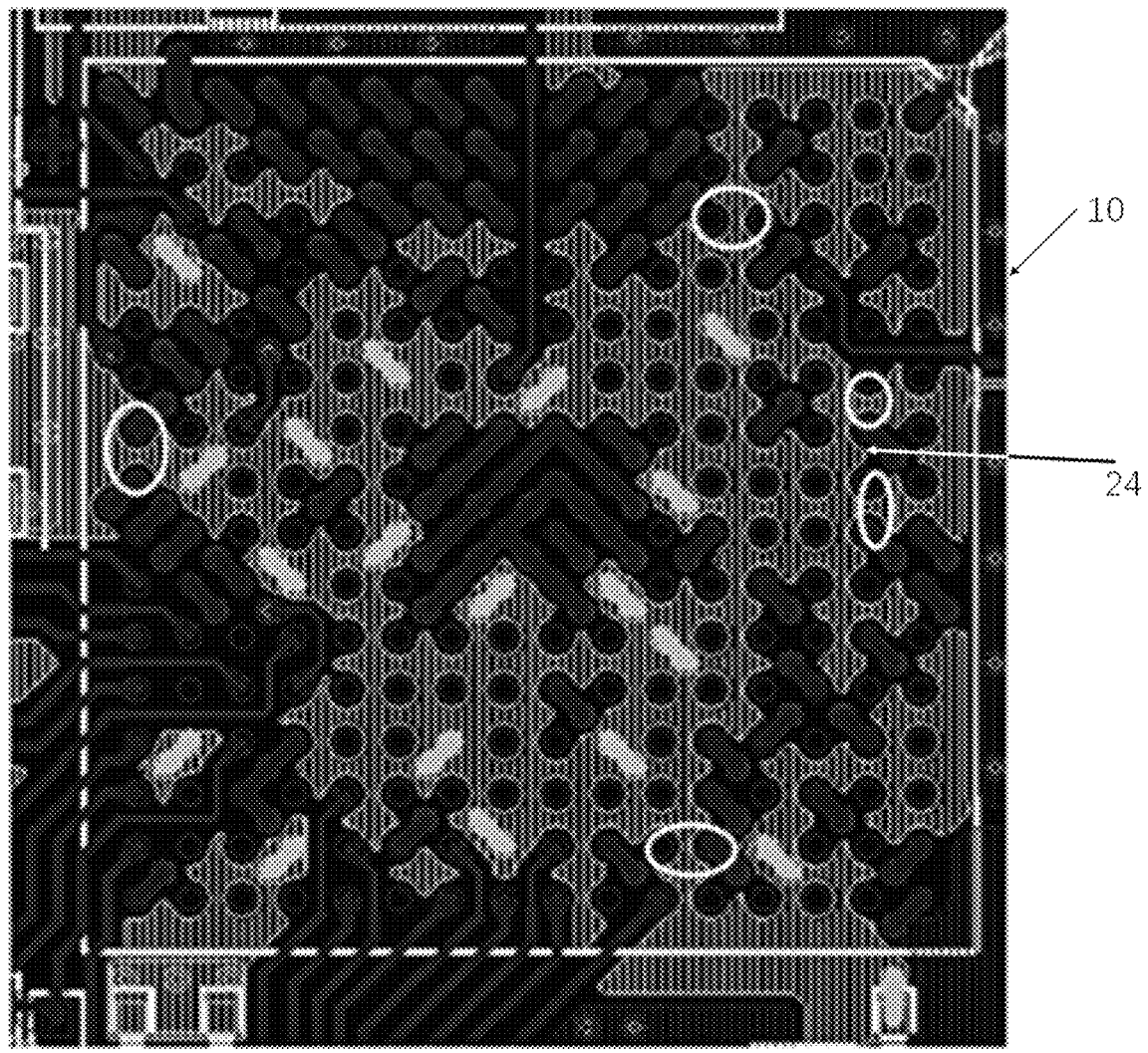
FIG. 2 is a schematic diagram of design of a conventional printed circuit board.
Figure 3:
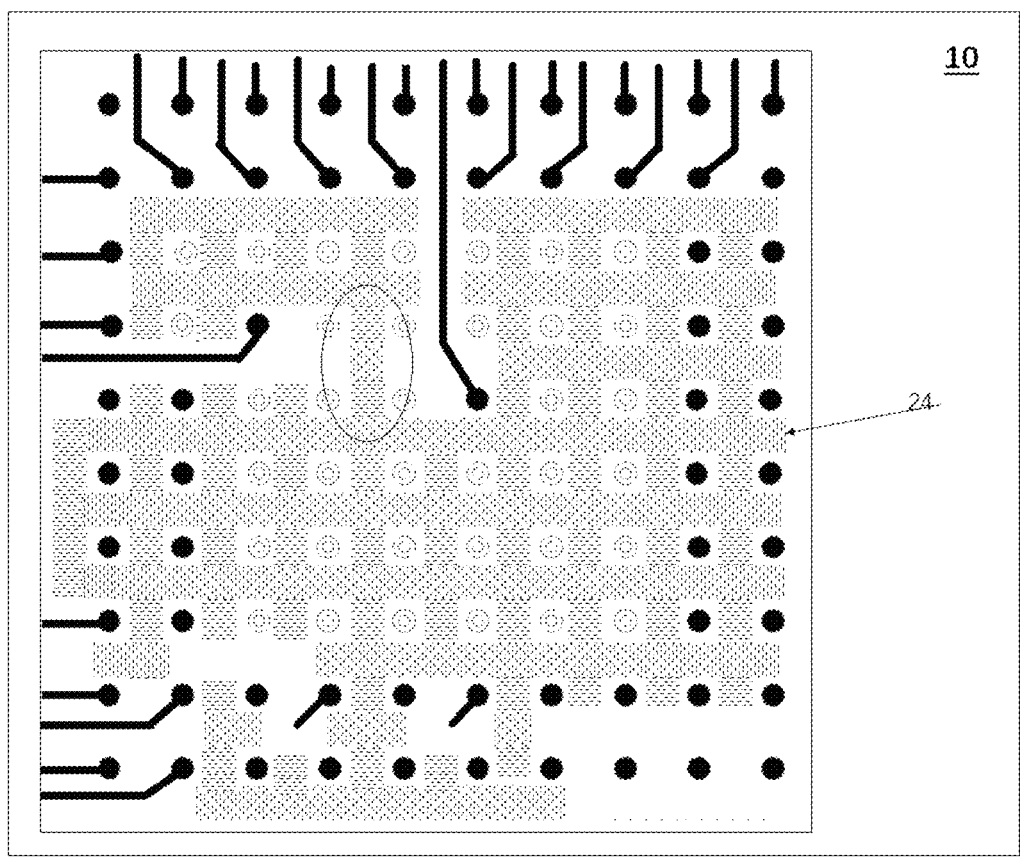
FIG. 3 is a simplified diagram of design of the conventional printed circuit board.
Figure 9:
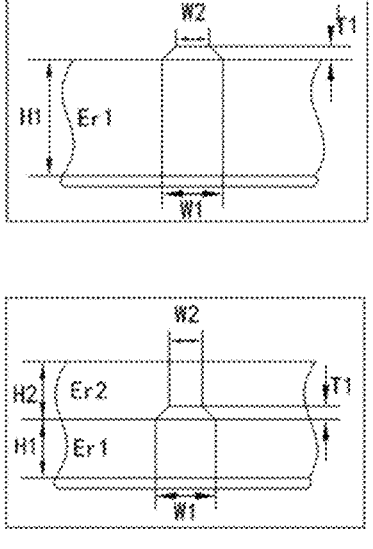
FIG. 9 is analysis results of routing capacity and current flow capacity of the corresponding conventional printed circuit board of FIG. 2.

FIG. 9 is analysis results of routing capacity and current flow capacity of the corresponding conventional printed circuit board of FIG. 2, which shows analysis results of routing and current flow capacities of a single channel in FIG. 2. As can be known from FIG. 9, a line width of a single routing channel is 8 Mil, and under the condition of 10 degrees of temperature rise, a current carrying capacity of the single routing channel is 0.8 A, so a total current carrying capacity for routing and current flow of five channels in FIG. 2 is 4 A. As can be known, the current carrying capacity of the wiring channel can be greatly improved by using the design of the optimized printed circuit board of the invention.

A precondition stated above is the programmable chip, so not only for the programmable chip, but for change of the network of the unused pins does not change functional or electrical characteristics of the chip or device, the wiring channel can be effectively increased through the above method, such as, a network port tested by an over high voltage. Since a network port connector has plastic fixed pins, such pins reduce a width of the wiring channel of a chassis ground network, and a high voltage cannot be effectively released to the chassis ground during testing with the high voltage, such that holes without electrical function can be made into plated through holes, and imparted to the chassis ground network, which increases the width of the chassis ground, and can release the high voltage to the chassis ground faster.

For the purpose of brief description, any technical feature that can act for the same application in the first embodiment is described herein, and the same content is not repeated.

Till now, a wiring method for a printed circuit board according to the second embodiment of the invention has been introduced.

Figure 10:
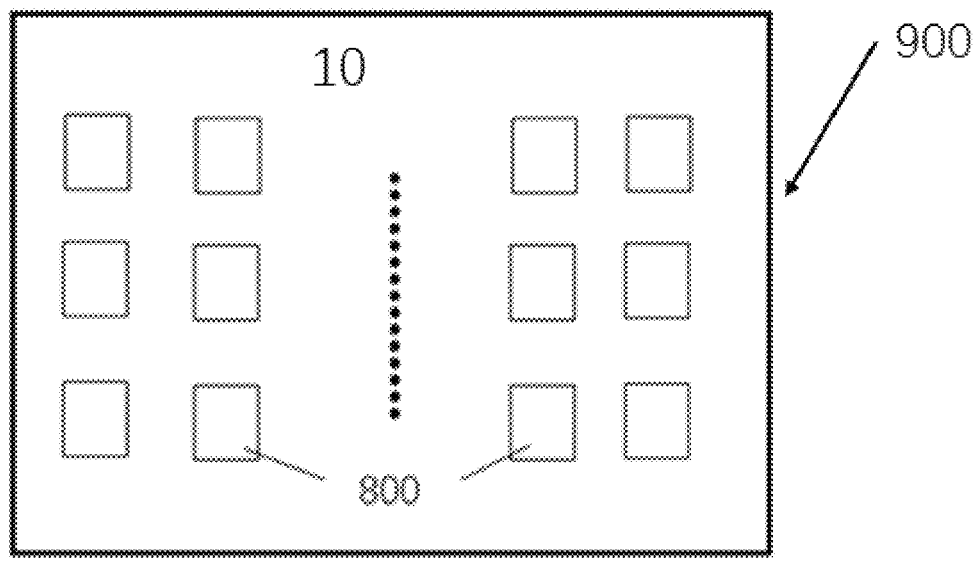
FIG. 10 is a schematic diagram of a computing board according to the invention.

The invention further provides a computing board, and FIG. 10 is a schematic diagram of the computing board according to the invention. As shown in FIG. 10, each computing board 900 comprises one or more chips 800 mounted on the printed circuit board 10 for performing a hash operation on operational data sent from a mining pool.

Figure 11:
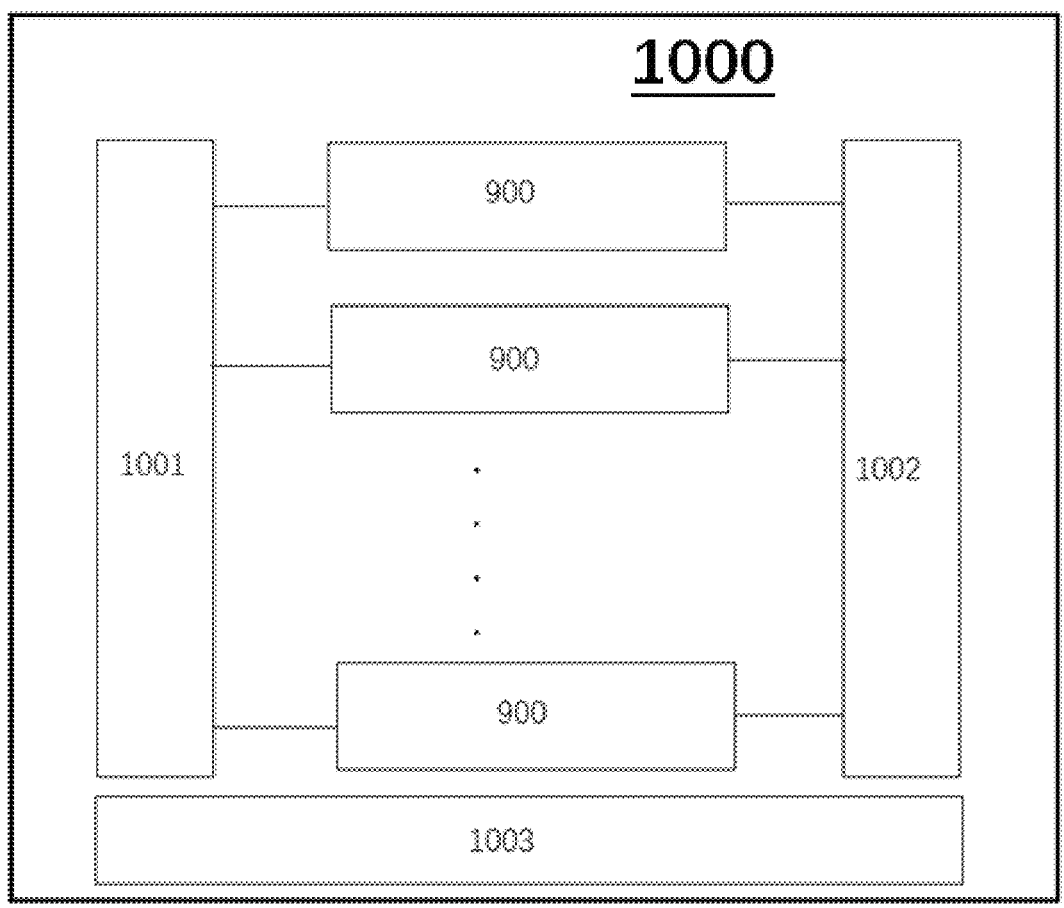
FIG. 11 is a schematic diagram of a computing device according to the invention.

The invention further provides a computing device, and FIG. 11 is a schematic diagram of the computing device according to the invention. As shown in FIG. 11, each computing device 1000 comprises a connecting board 1001, a control board 1002, a heat radiator 1003, and one or more computing boards 900. The control board 1002 is connected to the computing board 900 through a connecting board 1001, and the heat radiator 1003 is disposed around the computing board 900.

Till now, the embodiments of the invention have been explicitly described with reference to the accompanying drawings. It shall be noted that implementations not illustrated or described in the accompanying drawings or the specification are in a form known by those skilled in the art without describing in detail. In addition, definitions to the various elements and methods are not limited to various specific structures, shapes or ways set forth in the embodiments, and those skilled in the art can make simple modifications or replacements.

Moreover, shapes and sizes of the respective components in the figures do not reflect actual sizes and proportions, but only illustrate the contents of the embodiments of the invention. Furthermore, in the claims, any reference signs in brackets shall not be constructed as limitation to the claims.

Unless otherwise indicated, numerical parameters in the specification and the appended claims are approximate values, and can vary depending on the desired characteristics obtained by the invention. Specifically, all numbers representing compositions, reaction conditions, and the like used in the specification and claims shall be understood to be modified by the term "about" in all circumstances. Generally, the expressed meaning refers to including variations of a specific number by ±10% in some embodiments, by ±5% in some embodiments, by ±1% in some embodiments, and by ±0.5% in some embodiments.

In addition, unless steps are particularly described, or must carry out sequentially, sequence of the steps is not limited to that listed above, and can be changed or rearranged according to the desired design. Moreover, the embodiments can be mixed and matched, or mixed and matched with other embodiment based on considerations of design and reliability. That is, technical features in different embodiments can be freely combined to form more embodiments.

Those skilled in the art may understand that the modules of the device in the embodiment can be adaptively changed, and configured in one or more devices different from that in the embodiment. The modules or units or components in the embodiment can be combined into one module or unit or component, and also can be divided into a plurality of sub-modules or sub-units or sub-components. Except that some of the features and/or processes or units are mutually exclusive, all features disclosed by the invention (including accompanying claims, abstract and drawings) can be combined with all processes or units of any method or device disclosed in such way using any combination. Unless otherwise clearly stated, each feature disclosed by the invention (including accompanying claims, abstract and drawings) can be replaced by alternative feature providing the same, equivalent or similar purpose. Furthermore, in the unit claims listing several apparatus, several of these apparatuses can be embodied by the same hardware item.

Similarly, it shall be understood that in the exemplary embodiments of the invention, respective features of the invention are sometimes grouped into a single embodiment, figure, or description thereof for the purpose of simplifying the invention and assisting in understanding one or more of various disclosures. However, the disclosed method shall not be interpreted to reflect the intention that the invention as claimed shall have more features than that clearly recorded in each claim. To be more accurate, as reflected in the following claims, the disclosures lie in fewer than all features of a single embodiment disclosed previously. Therefore, the claims following a detailed embodiment are hereby clearly incorporated into the detailed embodiment, where each claim itself acts as a separate embodiment of the invention.

The above-mentioned detailed embodiments further explicitly explain objects, technical solutions and advantageous effects of the invention. It shall be understood that they are only detailed embodiments of the invention, instead of limiting the invention. Any modifications, equivalent replacements, improvements, and the like made within spirit and principle of the invention shall be included in the protection scope of the invention.

It shall be noted that in the invention, the orientations or positional relationships indicated by the terms "transverse", "longitudinal", "upper", "lower", "front", "back", "left", "right", "vertical", "horizontal", "top", "bottom", "inner", "outer", and the like are orientations or positional relationships illustrated by the drawings, and are only for the purpose of describing the invention and simplifying the explanations, rather than indicating or suggesting that the referred apparatus or element must have a specific orientation, and be constructed and operated in a specific orientation, so it cannot be understood as limitation to the invention.

Although solutions of the invention have been disclosed above, they are not limited to applications listed in the specification and the embodiments, but completely applicable to various fields suitable for the invention. For those skilled in the art, additional modifications are easily achievable, so the invention is not limited to specific details and examples shown and described herein without departing from the general concept defined by the claims and their equivalent scopes.

In other words, the invention also may have other various embodiments. Those skilled in the art shall make various corresponding changes and modifications to the invention without departing from spirit and essence of the invention, but these corresponding changes and modifications shall belong to the scope protected by the appended claims of the invention.

INDUSTRIAL APPLICABILITY

Advantageous effects achieved by using the structure and the wiring method for a printed circuit board are as follows:

(1) The used pins of the chip are connected to a power supply or ground as required through the wiring channel on the layer where the chip is located, without avoiding pins of network of the non-wiring channel, so the wiring channel on the layer where the chip is located can be effectively used to lead out the power supply or ground, and it is unnecessary to punch holes to be connected to the internal wiring channel layer, thereby reducing the number of the printed circuit board layers, and further lowering product cost and production cycle;

(2) A width of the wiring channel is increased by configuring unused I/O pins to a power supply or a ground network, and since the I/O pins on the printed circuit board are coated with tin paste for soldering with the chip, the channel becomes larger. Moreover, since the tin paste and pins of the chip itself carry current also, the width of the wiring channel is increased, a thickness thereof is increased also, and the current carrying capacity far exceeds that of the internal wiring channel layer connected by punching holes.

What is claimed is:

1. A printed circuit board structure, comprising:
   a first wiring channel formed inside the printed circuit board for transmitting a circuit signal; and
   pins connected to the first wiring channel for connecting a chip to the printed circuit board, the pins comprising unused pins and used pins, and the used pins comprising peripheral pins and internal pins;
   wherein the printed circuit board further comprises a second wiring channel that leads out the internal pins by covering at least a portion of the unused pins;
   wherein a preset level network is further formed on the printed circuit board, and wherein the second wiring channel is disposed on a layer where the chip is located for leading out the internal pins to be connected to the preset level network;
   wherein the used pins are pins configured in different modes for realizing desired functions of circuit design, and wherein the unused pins are pins that are not used for realizing the desired functions.

2. The printed circuit board structure according to claim 1, wherein at least a portion of the covered unused pins comprises the unused pins on a path of the second routing channel.

3. The printed circuit board structure according to claim 2, wherein connection of the unused pins on the path of the second wiring channel and the preset level network does not affect functional/electrical characteristics of the chip.

4. The printed circuit board structure according to claim 3, wherein the preset level network is a network with a fixed level.

5. The printed circuit board structure according to claim 4, wherein the preset level network is a power supply and/or a ground network.

6. The printed circuit board structure according to claim 5, wherein the chip is a programmable logic device.

7. The structure according to claim 6, wherein the unused pins of the chip on the path of the second wiring channel are programmable, and wherein a voltage of the preset level network connected thereto does not exceed a voltage set by the unused pins.

8. A wiring method for a printed circuit board, comprising:
   planning a planning path connected to a preset level network according to the preset level network;
   configuring pins on the printed circuit board according to the planning path;
   configuring the pins as used pins and unused pins;

configuring a preset level for the unused pins according to function and requirement of the chip; and forming a wiring channel according to distribution of the preset level network and the planning path;

wherein the wiring channel covers at least a portion of the unused pins on the planning path, and is connected to the preset level network;

wherein the wiring channel is disposed on a layer where the chip is located for leading out the unused pins to be connected to the preset level network;

wherein the unused pins on the planning path are programmable, wherein a voltage of the preset level network connected thereto does not exceed a preset level configured for the unused pins, and wherein connection to the preset level network does not change functional/electrical characteristics of the chip.

9. The printed circuit board structure according to claim 8, wherein the covered unused pins comprise the unused pins on the planning path.

10. The wiring method according to claim 9, wherein a level of the preset level network is fixed.

11. The wiring method according to claim 10, wherein the preset level network is a power supply and/or a ground network.

12. A computing board for a computing device, comprising a printed circuit board and a plurality of computing chips mounted on the printed circuit board, wherein the printed circuit board comprises any one of the printed circuit boards according to claim 1.

13. A computing device, comprising a control board, a connecting board, a heat radiator, and a plurality of computing boards connected to the control board through the connecting board, the heat radiator arranged on lateral sides of the computing boards, wherein the computing boards are any one of the computing boards according to claim 12.

* * * * *